United States Patent [19]

Roberts et al.

[11] Patent Number: 4,470,189
[45] Date of Patent: Sep. 11, 1984

[54] PROCESS FOR MAKING POLYCIDE STRUCTURES

[75] Inventors: Stanley Roberts, South Burlington; Francis R. White, Essex Junction, both of Vt.

[73] Assignee: International Business Machines Corporation, Armonk, N.Y.

[21] Appl. No.: 497,372

[22] Filed: May 23, 1983

[51] Int. Cl.³ .................... H01L 21/283; C23C 15/00
[52] U.S. Cl. ........................................ 29/571; 29/578; 29/591; 148/1.5; 156/643; 204/192 E; 427/93
[58] Field of Search ............... 204/192 E, 192 EC; 156/643; 29/571, 578, 591; 148/1.5; 427/89, 93; 357/71

[56] References Cited

U.S. PATENT DOCUMENTS

| | | | |
|---|---|---|---|
| 4,128,670 | 12/1978 | Gaensslen | 427/86 |
| 4,180,596 | 12/1979 | Crowder et al. | 427/42 |
| 4,329,706 | 5/1982 | Crowder et al. | 357/71 |
| 4,352,716 | 10/1982 | Schaible et al. | 156/643 |
| 4,360,414 | 11/1982 | Beinvogl | 204/192 E |
| 4,362,597 | 12/1982 | Fraser et al. | 156/643 |
| 4,378,628 | 4/1983 | Levinstein et al. | 29/571 |
| 4,389,257 | 6/1983 | Geipel, Jr. et al. | 148/1.5 |
| 4,398,341 | 8/1983 | Geipel, Jr. et al. | 29/578 |
| 4,411,734 | 10/1983 | Maa | 156/643 |
| 4,414,057 | 11/1983 | Bourassa et al. | 156/643 |

OTHER PUBLICATIONS

F. R. White et al., "Plasma Etching of Composite Silicide Gate Electrodes", *J. Electrochem. Soc.*, vol. 129, pp. 1330-1335 (1982).
R. S. Bennett et al., "Process for Reactive Ion Etching of Polycide", *IBM Tech. Disc. Bull.*, vol. 24, p. 4486 (1982).
Crowder et al. "1μm MOSFET VLSI Technology ... A Future Perspective" *IEEE J. Sol. State Cir.*, vol. SC 14, No. 2, pp. 291-293, Apr. 1979.
Bennett et al. "Process for Reactive Ion Etching of Polycide" *IBM Tech. Discl. Bull.*, vol. 24, No. 9, Feb. 1982.
Howard "Gate for MOS Devices: Rare Earth Silicides" *IBM Tech. Disl. Bull.*, vol. 21, No. 7, Dec. 1978, pp. 2811-2813.

*Primary Examiner*—Aaron Weisstuch
*Attorney, Agent, or Firm*—George Tacticos

[57] ABSTRACT

An improved method for making polycide structures for use in electrode and wiring interconnection applications. It includes depositing a layer of polysilicon on an insulating layer and forming on this polysilicon layer a silicide structure and a silicon capping layer. The deposited layers are defined and etched through dry etching techniques using a dry etching mask made of a refractory metal that does not form a volatile halide in a dry etching environment. Metals with such characteristics include cobalt (Co), nickel (Ni), iron (Fe), and manganese (Mn). The metal mask and the other deposited layers may be formed and defined using a photoresist mask as a deposition mask formed to be compatible with lift-off techniques.

The silicide may be deposited either through a chemical vapor deposition process or through evaporation techniques. If it is formed through the co-evaporation of metal and silicon, then the structure is subjected to a low temperature reaction annealing step at a temperature between 500° and 600° C. prior to dry etching. To avoid a diffusion of the metal mask into the silicon layer, during this low temperature annealing, the process provides for the formation of a diffusion barrier layer between the metal mask and the silicon layer.

Following the removal of the metal mask and the diffusion barrier layer, the structure is annealed at a temperature sufficient to cause the homogenization of the silicide layer.

18 Claims, 8 Drawing Figures

PROCESS FOR MAKING POLYCIDE STRUCTURES

DESCRIPTION

1. Technical Field

This invention relates in general to a process for making polysilicon-silicide structures for use in integrated semiconductor circuits. More particularly, it relates to a new and improved process for etching silicide and polysilicon layers and defining the geometry of the resulting structures using an improved reactive ion etch mask deposited by evaporative lift-off techinques.

2. Cross Reference to a Related Patent Application

In a copending U.S. Pat. application Ser. No. 387,315, filed on June 11, 1982, entitled, "Method of Fabricating a Highly Conductive Structure" by Ning Hsieh et al and assigned to the present assignee, now U.S. Pat. No. 4,432,035, there is disclosed and claimed a method for forming a silicide structure.

3. Background Art

Polycrystalline silicon, hereafter referred to as polysilicon, has been used in semiconductor technology because of its high temperature stability and its ability to provide a stable insulating layer by self-passivation. Doped polysilicon has been used as an electrode and interconnecting line material especially for applications requiring conductive materials that are self-passivating. However, the scaling down of device dimensions causes the resistance of polysilicon lines to increase to levels which seriously impair device performance. To alleviate this problem and to produce high density integrated circuits with electrodes and wiring interconnections of decreasing dimensions while retaining low sheet resistivity, different types of metal silicides have been developed for use in such applications. Metal silicides may be used with or without doped polysilicon layers for a variety of electrode and wiring interconnection applications. In addition to their low sheet resistivity, silicides may also be self-passivating, as a layer of silicon dioxide forms on the free or open surfaces of the silicide when exposed to an oxidizing ambient. A composite conducting line of doped polysilicon and metal silicide is referred to as polycide. Polycide structures yield the combined advantage of high conductivity and reduced parasitic capacitance. A method for making silicides is taught in U.S. Pat. No. 4,128,670, entitled, "Fabrication Method for Integrated Circuits with Polysilicon Lines Having Low Sheet Resistance," issued on Dec. 5, 1978 to Fritz H. Gaensslen and assigned to the present assignee. It describes a method of fabricating a silicide which includes depositing a first layer of polysilicon on a substrate, and then a silicide forming metal and a second layer of polysilicon without breaking vacuum, and annealing, with the metal reacting at two surfaces with the polysilicon to provide the silicide. U.S. Pat. No. 4,180,596, issued on Dec. 25, 1979 to Crowder et al teaches co-evaporation of silicon and a silicide-forming metal, such as molybdenum, tantalum, tungsten, rhodium and mixtures thereof, to produce a silicide layer. This patent also teaches the removal of the silicide material from predetermined portions of the substrate supporting the silicide by lift-off techniques. An article by B. L. Crowder et al, entitled, "1 $\mu$m MOSFET VLSI Technology: Part VII—Metal Silicide Interconnection Technology—A Future Perspective", published in IEEE Journal of Solid State Circuits, Vol. SC. 14 No. 2, pp. 291–293, in April 1979, discloses techniques for fabricating polycides including patterning by Reactive Ion Etching (RIE), using an aluminum (Al) RIE mask.

U.S. Pat. No. 4,329,706, entitled, "Doped Polysilicon Silicide Semiconductor Integrated Circuit Interconnections", issued on May 11, 1982 to B. L. Crowder et al discloses the use of a polycide material for interconnecting members. The silicide layer is formed or deposited by co-evaporation, sputtering or chemical vacuum deposition so that in the process either the metal combines with the polysilicon to form the silicide or in the alternative the silicide is made up of a mixture of co-deposited metal and silicon. The materials are etched using conventional etching techniques. U.S. Pat. No. 4,378,628, entitled, "Cobalt Silicide Metallization for Semiconductor Integrated Circuits", issued on Apr. 5, 1983 to Hyman J. Levinstein et al, discloses a method for making cobalt disilicide electrode metallization contacts to underlying silicon. It includes depositing and then sintering a layer of cobalt on a patterned semiconductor wafer having exposed polysilicon or monocrystalline silicon portions. The cobalt reacts with the exposed silicon portions and forms cobalt monosilicide (CoSi) or di-cobalt silicide ($Co_2Si$) or a mixture of both. The unreacted cobalt is selectively removed, as by selective etching in a suitable acid bath. This is then followed by a heat treatment to convert the cobalt compound(s) into cobalt disilicide ($CoSi_2$). A layer of polysilicon is deposited over the cobalt disilicide, followed by gettering, a deposition of aluminum and standard etch-patterning of the aluminum and polysilicon layers.

An article by R. S. Bennett et al entitled, "Process for Reactive Ion Etching of Polycide" published in IBM Technical Disclosure Bulletin, Vol. 24, No. 9, Feb. 1982 discloses a two-step process for selectively etching a polycide structure using an aluminum mask. In the first step Reactive Ion Etching (RIE) is used to control the line width as well as the etch profile of the silicide. In the second step plasma etching is used and it stops at an underlying silicon dioxide layer.

The aforementioned copending U.S. Pat. No. 4,432,035 discloses a method of making a silicide structure which includes the steps of depositing a metal layer directly onto a thin insulating layer of silicon dioxide formed on a semiconductor substrate, co-depositing metal and silicon onto the metal layer and then depositing silicon onto the co-deposited metal-silicon layer. Upon annealing this structure, a metal silicide forms down to the thin silicon dioxide layer.

The developments disclosed in the aforementioned publications and patents represent significant advances in this art, as explained in detail in said publications and patents.

Our present invention extends the developments in this area of technology and has further advantages and flexibilities.

DISCLOSURE OF THE INVENTION

It is an object of this invention to provide a process of making a highly conductive polycide structure with improved line definition and line width control.

It is another object of this invention to provide a process for forming a polycide structure wherein all elements in the polycide structure have a uniform line width.

It is yet another object of this invention to provide an improved process for forming a polycide structure which method is compatible with evaporative lift-off techniques.

It is still another object of this invention to provide a process for forming a polycide structure wherein the silicide is formed through evaporative lift-off techniques and an underlying polysilicon layer is formed through a reactive-ion-etching process using a mask which does not erode during RIE etching, and which can be removed following the etching step without leaving behind any contaminants and which do not affect any of the component materials in the polycide structure.

In accordance with the teachings of this invention, an improved process is provided for forming a polycide structure which includes forming a layer of an insulating material on a semiconductor substrate, forming a layer of polysilicon over the insulating layer and depositing a layer of photoresist material over the polysilicon layer. A desired pattern is formed in the photoresist layer exposing portions of the underlying polysilicon layer and a composite metal-silicon layer is formed by co-depositing silicon and silicide forming metal on the exposed portions of the polysilicon layer. A layer of silicon is deposited over the composite metal-silicon layer and an appropriate diffusion barrier layer, e.g. tungsten, is deposited over this silicon layer. A layer of a refractory metal is deposited over the diffusion barrier layer for use as a dry etching mask. This metal is selected from a group of refractory metals which do not form volatile halides within the temperature range used during dry etching. By not forming a volatile halide, the material will act as a dry etching mask. It is also necessary that this metal can be removed by wet etching with etchants that do not etch silicon or silicon-containing compounds. Certain metals such as cobalt (Co), nickel (Ni), iron (Fe), or manganese (Mn) have such characteristics. This is followed by a lift-off operation for the removal of the photoresist mask and all excess materials on this mask and a reaction annealing step to cause the metal and silicon in the composite metal-silicon layer to react and form a metal silicide layer. The exposed portions of the polysilicon layer are removed through dry etching and this is subsequently followed by the removal of the metal and the adjacent diffusion barrier layer and an annealing step to homogenize the metal silicide layer.

Alternatively, a polycide structure may be formed by depositing a silicide layer through a conventional process, such as a chemical vapor deposition on a polysilicon layer and then depositing a silicon capping layer over the silicide layer. The deposited layers are then defined and etched using a dry etching mask made of a refractory metal in accordance with the teachings of this invention. The dry etching mask may be formed by first forming a photoresist mask on the silicon layer and then using this mask for depositing a predetermined metal on portions of the silicon layer that needs to be protected during the dry etching. The photoresist mask with all excess materials are then removed. A dry etching step, such as for example a RIE step, is then used to remove the exposed portions of the silicon layer and the underlying portions of the silicide and the polysilicon layers. The portions of these layers that are covered by the metal mask are protected during dry etching. Since with this approach the silicide material is formed prior to its deposition on the polysilicon layer, there is no need to have a reaction annealing step prior to dry etching and no need to heat the structure to a temperature level that can cause the metal mask to diffuse into the silicon layer. Therefore with this alternative approach for practicing this invention, it is not necessary to have a diffusion barrier layer between the silicon layer and the metal mask.

The foregoing and other objects, features, and advantages of the invention will be apparent from the following and more particular description of the preferred embodiments of the invention, as illustrated in the accompanying drawings.

BEST MODE FOR CARRYING OUT THE INVENTION

Figure 1:
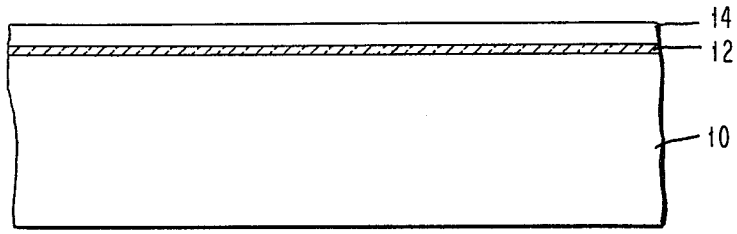
FIGS. 1 through 7 illustrate, in a series of diagrammatic cross-sectional views, a sequence of some of the most important process steps of the invention.
Figure 2:
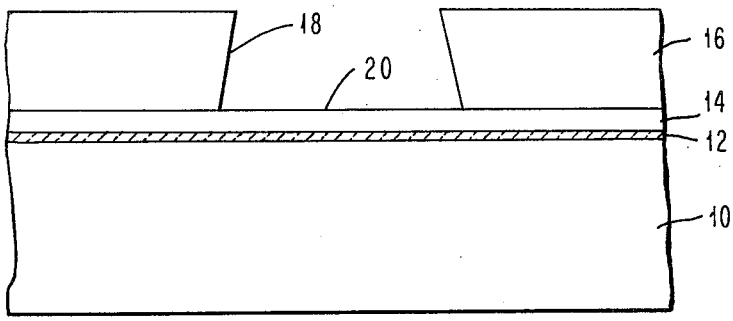
Figure 3:
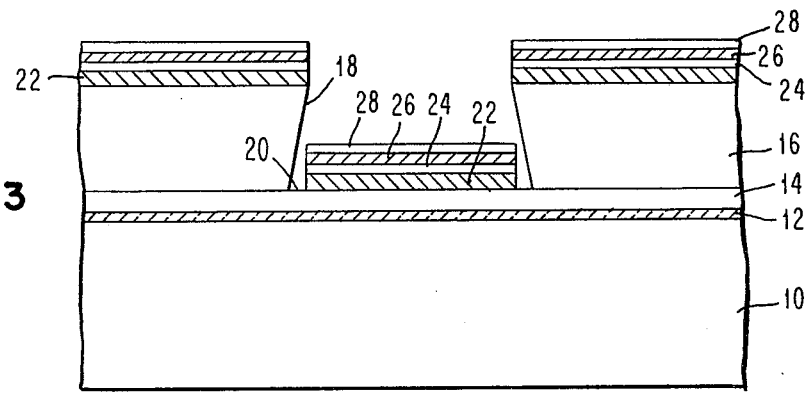
Figure 4:
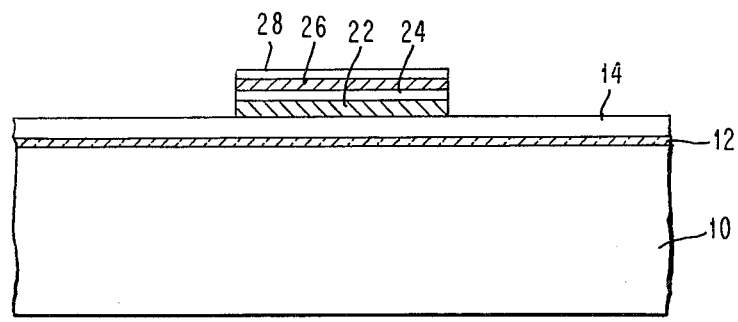
Figure 5:
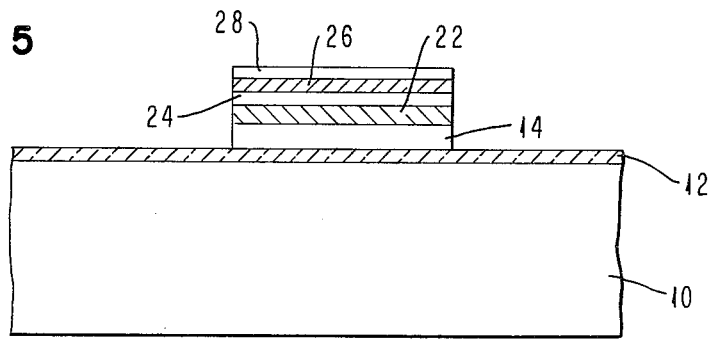
Figure 6:
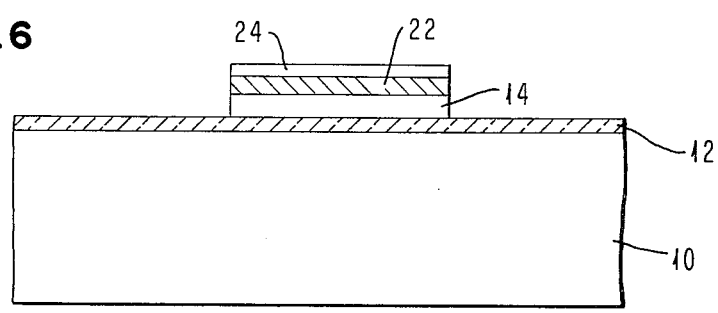
Figure 7:
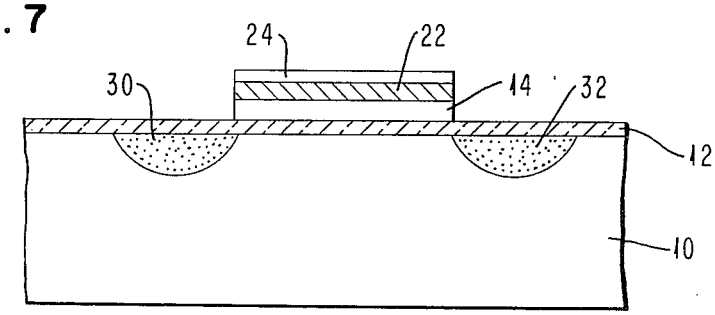

Referring now to FIG. 1, there is shown a semiconductor substrate 10 which may be N-type or P-type monocrystalline silicon depending on the planned uses of the resulting structure. On substrate 10, there is an insulating layer 12 which in the case of a silicon substrate may be a layer of silicon dioxide ($SiO_2$) which may be grown through the thermal oxidation of silicon. If the resulting polycide structure is to be used as a gate electrode then this layer 12 will form the gate dielectric and will typically have a thickness in the range of 200 to 500 Å. A blanket layer 14 of doped polysilicon is deposited on layer 12. This layer of polysilicon can be of any suitable thickness but is typically in the range of 1,000 to 4,000 Å. In FIG. 2 there is shown a photoresist layer 16 with an opening 18 formed therein, by known techniques, to expose a predetermined portion of the surface 20 of the polysilicon layer 14. The definition of opening 18 and the photoresist slope angles are designed to be compatible with lift-off techniques. In FIG. 3 there is shown the structure after the sequential deposition through the opening 18 and over the photoresist mask of several layers. On top of exposed portion of polysilicon layer 14 is a metal silicide layer 22 as indicated in FIG. 3. The thickness of layer 22 is in general dependent on the thickness of polysilicon layer 14. Typically, the thickness of silicide layer 22 should be comparable to the thickness of layer 16 which is typically in the range of 1,000 to 4,000 Å. The metal of the metal silicide layer 22 is preferably a refractory metal such as cobalt, tungsten, titanium, niobium, molybdenum, tantalum, iridium, or rhodium. The metal silicide layer 22 can be deposited by any suitable technique, such as the co-evaporation of the metal and silicon while heating the respective targets of metal and silicon with E-Beams. This forms first a composite metal-silicon layer which during a subsequent annealing step turns into the corresponding metal silicide layer. Then, pure silicon layer 24 is deposited over layer 22 to serve as a capping layer to improve the subsequent oxidation behavior of the overall polycide structure. A thin diffusion barrier layer 26 such as a layer of tungsten (W) is deposited again through evaporation over silicon layer 24. The typical thickness of this layer is in the range between 250 and 500 Å. A tungsten layer 26 will not react with the silicon capping layer 24 below the temperature range of 650° C. to 700° C. On top of the thin diffusion barrier layer 26, there is deposited a masking layer 28. This masking layer is made of a refractory metal that does not form a volatile halide in a dry etching environment and can be removed through wet etching with chemicals that do not etch the other materials present in the structure without contaminating the structure. Furthermore, this masking material must be compatible with the diffusion barrier layer material so that it does not chemically react with that material. Among the metals that have such characteristics are nickel (Ni), iron (Fe), cobalt (Co), and manganese (Mn). Thus, metal mask 28 may be formed, for example, by the evaporation of cobalt (Co) over tungsten (W) layer 26. This is followed by removal through a conventional lift-off step of the photoresist layer 16 with all the excess materials deposited on it. This results in a structure as shown in FIG. 4. Then there is a need for the structure to go through low temperature reaction annealing at a temperature preferably in the range of 500° to 600° C. for a reaction of the metal and silicon in the composite metal-silicon layer to form the corresponding metal silicide. At this temperature range the W will not react with Si, and Co will be prevented from diffusing into Si by the W layer that separates the two. Following the lift-off step, the structure is then subjected to dry etching, preferably a RIE step, to remove the polysilicon layer 14 from all but the gate region as defined by metal mask 28 and to produce vertical gate electrode sidewalls. A RIE can be performed using an environment such as $CF_4 + O_2$. During this step, if the metal mask is made of Co, then Co will react with $CF_4$ to form a thin layer of cobalt fluoride ($CoF_2$) on top of Co mask 28. This thin layer of $CoF_2$ will protect the remaining Co layer from erosion since it is not volatile during the RIE step. This will assure that the sidewalls of the gate electrode will be vertical. This etching will stop when the unmasked portion of polysilicon layer 14 is entirely removed, that is, when it reaches the surface of $SiO_2$ layer 12, as shown in FIG. 5. The metal mask is then removed using a conventional chemical cleaning process. For example a mixture of HCl, $H_2O_2$ and $H_2O$ will remove a Co, Fe, Ni, or Mn mask from a polycide structure at 60°–70° C. in about 5 minutes. Then the tungsten (W) layer 26 is also removed using a conventional wet etching step such as, for example, with a mixture having of $NH_4OH$, $H_2O_2$ and $H_2O$ at 60°–70° C. for about 5 minutes to produce the structure shown in FIG. 6. Using a conventional ion implantation step and the gate electrode as a implantation mask self-aligned source and drain regions 30 and 32 may be formed in the substrate. This results in the structure shown in FIG. 7. This is followed by a homogenization anneal at a temperature range of 950° to 1100° C. for the further homogenization of the silicide structure.

Figure 8:
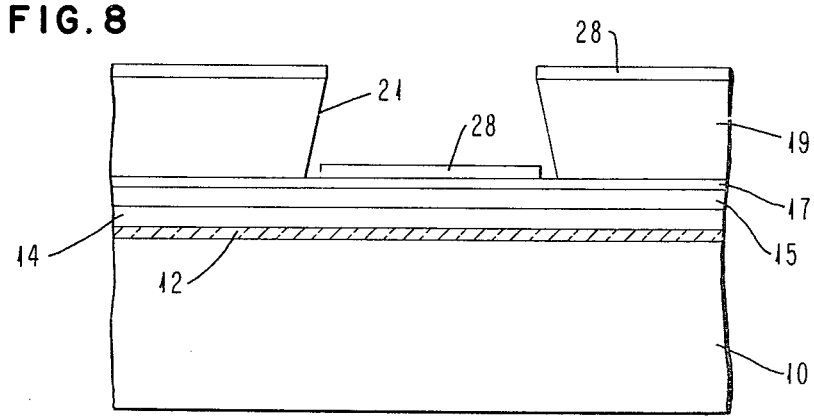
FIG. 8 illustrates an alternative way of defining the polycide structure in accordance with the teachings of the invention.

In FIG. 8 there is shown an alternative method for practicing the invention, wherein first an insulating layer 12 is formed on a substrate 10. A polysilicon layer 14 is deposited on the insulating layer 12 and a metal silicide layer 15 is deposited through chemical vapor deposition on the polysilicon layer 14. A silicon capping layer 17 is deposited over the metal silicide layer 15 and a photoresist mask 19 is formed over silicon layer 17. This photoresist mask is made to be compatible with lift-off techniques. A refractory metal layer 28 selected from a group of metals consisting of cobalt, iron, nickel, and manganese, is deposited through opening 21 onto exposed portion of silicon layer 17. The photoresist mask 19 and the excess refractory metal on it are lifted off and the structure is then dry etched, using for example a RIE step, and using metal layer 28 as an etching mask. This results in a polycide structure on insulating layer 12. The mask is then removed with a chemical etch as described above in the discussions of FIG. 5.

While the invention has been described in connection with preferred embodiments, it will be understood that it is not intended to limit the invention to those embodiments described herein and shown in the drawings. On the contrary, it is intended to cover all alternatives, modification and equivalents, as may be included within the spirit and scope of the invention as defined by the appended claims.

What is claimed is:

1. A process for making a polycide structure comprising the steps of:
    depositing a polysilicon layer on an insulating layer;
    forming on said polysilicon layer a photoresist mask defining and exposing predetermined areas of said polysilicon layer;
    co-depositing silicon and a silicide forming metal on exposed portions of said polysilicon layer, thereby forming a composite metal-silicon layer on said polysilicon layer;
    depositing a layer of silicon over said metal-silicon layer;
    depositing a diffusion barrier layer on said layer of silicon;
    depositing a layer of a metal on said diffusion barrier layer, said metal selected from a group consisting of refractory metals that resist etching in a dry etching environment and which metals can be selectively removed from the underlying layers by wet etching techniques;
    removing said photoresist mask and all excess materials on said mask;
    reaction annealing said structure to cause said silicide forming metal and said silicon in said composite metal-silicon layer to react and form a metal silicide layer;
    removing through dry etching the exposed portions of said polysilicon layer;
    removing said layer of refractory metal and said diffusion barrier layer;
    annealing said structure to homogenize said metal silicide layer.

2. A process as set forth in claim 1 wherein said layer of refractory metal on said diffusion barrier layer is selected from the group consisting of cobalt, iron, nickel, and manganese.

3. A process as set forth in claim 2 wherein said diffusion barrier layer is a layer of tungsten.

4. A process as set forth in claim 3 wherein said dry etching is a RIE step.

5. A process as set forth in claim 4 wherein said insulating layer is a layer of silicon dioxide formed on a silicon substrate.

6. A process as set forth in claim 5, wherein said reaction annealing takes place at a temperature between 500° and 600° C.;

7. A process as set forth in claim 6, which further includes the step of forming source and drain regions in said silicon substrate following the removal of said exposed portions of said polysilicon layer and said refractory metal and said diffusion barrier layer, wherein said regions are formed by ion implantation through said silicon dioxide layer using the structure of said deposited layers as a gate electrode and wherein said gate electrode acts as an implantation mask for the formation of self-aligned source and drain regions.

8. A claim as set forth in claim 7 wherein said annealing to homogenize said metal silicide layer takes place at a temperature between 950° and 1100° C.

9. A process for making a polycide structure comprising the steps of:
  forming an insulating layer on a silicon substrate;
  depositing a polysilicon layer on said insulating layer;
  depositing a photoresist layer onto said insulating layer;
  forming an opening in said photoresist layer to expose predetermined portions of the surface of said polysilicon layer;
  co-depositing a refractory metal and silicon through said opening to form a composite metal-silicon layer on said exposed surface of said polysilicon layer;
  depositing silicon onto said composite metal-silicon layer to form a silicon layer;
  depositing a layer of tungsten onto said silicon layer to form a diffusion barrier layer;
  depositing a layer of a metal selected from the group consisting of cobalt, nickel, iron, and manganese onto said diffusion barrier layer to form a metal mask;
  removing through wet etching the remains of said photoresist layer, thereby exposing underlying portions of said polysilicon layer;
  reaction annealing said layers in an inert atmosphere at a temperature which is high enough to cause said composite metal-silicon layer to partially convert into a metal-silicide but not high enough to cause a reaction between said silicon layer and said diffusion barrier layer;
  removing through dry etching said exposed portions of said polysilicon layer down to the underlying deposited layers using said metal mask
  removing said metal mask and said layer of tungsten;
  annealing said layers at a temperature sufficient to homogenize said metal-silicide layer.

10. A process as set forth in claim 9, wherein said refractory metal and said silicon are deposited by co-evaporation.

11. A process as set forth in claim 10 wherein said refractory metal is a metal selected from the group consisting of molybdenum, tungsten, tantalum, iridium, titanium, cobalt, and rhodium.

12. A process as set forth in claim 11 wherein said dry etching of said polysilicon layer is accomplished through RIE.

13. A process as set forth in claim 12 wherein said metal mask is removed by wet etching with a mixture of hydrochloric acid, hydrogen peroxide, and water.

14. A process as set forth in claim 13 wherein said tungsten layer is removed by wet etching with a mixture of ammonium hydroxide, hydrogen peroxide, and water.

15. A process as set forth in claim 14 wherein said annealing to homogenize said metal-silicide layer takes place at temperature between 950° and 1100° C.

16. A process as set forth in claim 15 which further includes forming source and drain regions in said substrate through ion implantation using said deposited layers as an implantation mask.

17. A process for making a polycide structure comprising the steps of:
  depositing a polysilicon layer on an insulating layer;
  depositing a metal silicide layer on exposed portions of said polysilicon layer;
  depositing a layer of silicon over said layer of metal silicide;
  forming on said polysilicon layer a photoresist mask defining and exposing predetermined areas on said polysilicon layer;
  depositing a metal layer on said layer of silicon, said metal selected from a group consisting of refractory metals that do not form volatile halides in a reactive ion etching environment and which metals can be removed using reactive ion etching techniques with etchants that remove said metal without removing the underlying layers;
  removing said photoresist mask and all excess materials on said mask;
  removing through reactive ion etching portions of said silicon, said metal silicide and said polysilicon layers, using said layer of refractory metal as an etching mask;
  removing said metal layer through wet etching techniques;
  annealing said structure to homogenize said metal silicide layer.

18. A process as set forth in claim 17 wherein said metal layer is made of a metal selected from the group consisting of cobalt, iron, nickel, and manganese.

* * * * *